(12) United States Patent
Myers et al.

(10) Patent No.: US 7,183,653 B2
(45) Date of Patent: Feb. 27, 2007

(54) VIA INCLUDING MULTIPLE ELECTRICAL PATHS

(75) Inventors: Todd B Myers, Chandler, AZ (US);
Nicholas R. Watts, Phoenix, AZ (US);
Eric C Palmer, Tempe, AZ (US);
Renee M Defeo, Chandler, AZ (US);
Jui Min Lim, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 14 days.

(21) Appl. No.: 10/740,957

(22) Filed: Dec. 17, 2003

(65) Prior Publication Data

US 2005/0133918 A1  Jun. 23, 2005

(51) Int. Cl.
*H01L 23/48* (2006.01)
*H01L 23/52* (2006.01)
*Z01L 29/40* (2006.01)

(52) U.S. Cl. .................. 257/774; 257/758; 257/698
(58) Field of Classification Search ................ 257/773, 257/774, 777, 686, 758, 698
See application file for complete search history.

(56) References Cited

U.S. PATENT DOCUMENTS

| 3,577,037 | A | * | 5/1971 | Di Pietro et al. ........... 257/621 |
| 4,074,342 | A | * | 2/1978 | Honn et al. ................... 361/779 |
| 5,523,627 | A | * | 6/1996 | Abe et al. ..................... 257/774 |
| 5,949,030 | A | * | 9/1999 | Fasano et al. ............... 174/262 |
| 6,518,885 | B1 | * | 2/2003 | Brady et al. .............. 340/572.7 |
| 6,838,774 | B2 | * | 1/2005 | Patti ........................... 257/773 |
| 2005/0252683 | A1 | * | 11/2005 | Hsu .............................. 174/262 |
| 2006/0081396 | A1 | * | 4/2006 | Hsu ............................. 174/255 |

\* cited by examiner

*Primary Examiner*—S. V. Clark
(74) *Attorney, Agent, or Firm*—Schwegman, Lundberg, Woessner & Kluth, P.A.

(57) ABSTRACT

A system includes a device having at least one integrated circuit. The integrated circuit further includes a first layer of conductive material, a second layer of conductive material, and a via having multiple electrical paths for interconnecting the first layer of conductive material and the second layer of conductive material. A method for forming a via includes drilling an opening to a depth to expose a first pad and a second pad, lining the opening with a conductive material, and insulating a first portion of the lining in the opening from a second portion of the lining in the opening to form a first electrical path contacting the first pad and a second electrical path contacting the second pad.

28 Claims, 9 Drawing Sheets

VIA INCLUDING MULTIPLE ELECTRICAL PATHS

FIELD OF THE INVENTION

The present invention is related to formation of structures associated with semiconductor devices. More specifically, the present invention relates to methods and apparatus for forming a via including multiple electrical paths.

BACKGROUND OF THE INVENTION

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of several gigahertz (GHz), to be packaged in relatively small, air-cooled semiconductor device packages. A by-product of such high density and high functionality in semiconductor devices has been an ongoing pressure to further miniaturize the individual circuit features within an integrated circuit and packaging substrate, such as a microprocessor or a chip set component or the like.

There are many different features within an integrated circuit packaging substrate. One feature is a via. An integrated circuit packaging substrate contains several levels of circuitry. A via is a vertical opening lined with a conductive material that is used to connect conductor trace on one layer to the next layer. Currently, a via includes a single electrical path. Therefore, if there are multiple electrical paths between a first layer within a device to a second layer within a device, there are a corresponding number of vias. A via can also provide a conductive path from a layer within a device, such as an integrated circuit, to an exterior surface.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures, and:

The description set out herein illustrates the various embodiments of the invention, and such description is not intended to be construed as limiting in any manner.

DETAILED DESCRIPTION

In the following detailed description of the preferred embodiments, reference is made to the accompanying drawings that form a part hereof, and in which are shown by way of illustration specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
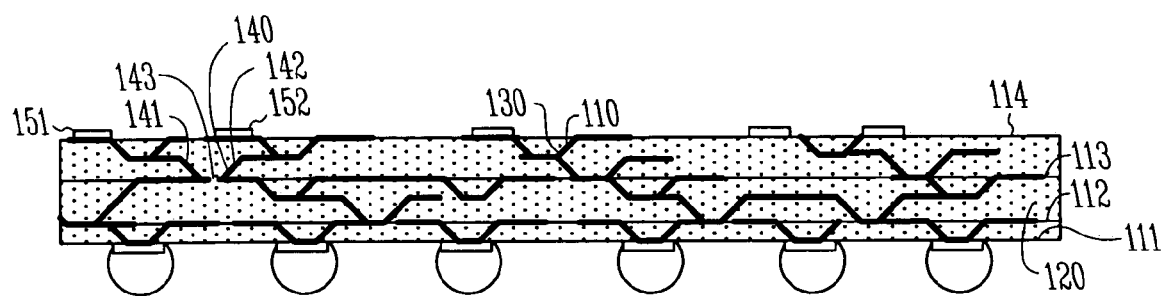
FIG. 1 is a cross-sectional schematic view of an integrated circuit packaging substrate including a plurality of vias, at least one of the vias formed according to an embodiment of this invention.

FIG. 1 is a cross-sectional schematic view of an integrated circuit packaging substrate 120 that includes a plurality of layers 111, 112, 113, 114 and a plurality of vias 110 therein.

The vias 110 are part of electrical paths 130 that connect portions of one of the layers 111, 112, 113, 114 to another of the layers 111, 112, 113, 114. According to an embodiment of this invention, at least one of the vias associated with the substrate 120, such as via 140, includes at least a first electrical path 141 and a second electrical path 142. The first electrical path 141 and the second electrical path 142 are separated by an insulator portion 144. The first electrical path electrically connects to device 151 on the exterior surface of the substrate 120. The second electrical path 142 electrically connects to device 152 on the exterior surface of the substrate 120. It is contemplated that a via 140 is not limited to two electrical pathways through the via 140, but could have any number of electrical pathways formed through the via 140. The number of electrical paths is only limited by the limits of photolithographic processes in forming the via 140. In addition, the number of electrical pads may also be limited by the physical spacing between the pads associated with each electrical paths. In other words, closely spaced pads could violate specified dielectric space restrictions between traces set forth as a manufacturing requirement. Generally, the higher the number of electrical pathways formed within a via 140, the less number of one electrical path vias that have to be formed. Use of the multi-path vias, such as via 140, will result in more compact packaging for devices within the substrate 120. Design tradeoffs will have to be balanced between the density of devices and the spacing between pads on the multi-path vias 140 associated with a particular substrate 120.

Figures 2, 3:
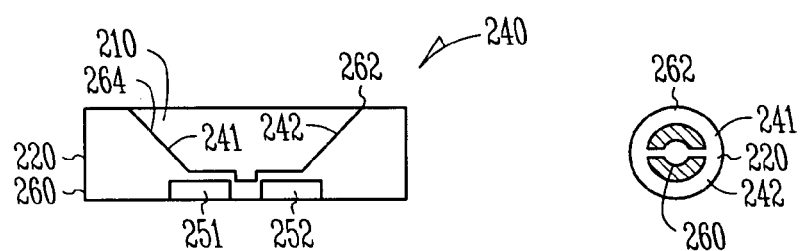
FIG. 2 illustrates a schematic cross-sectional view of a via having two conductive paths, according to an embodiment of this invention.
FIG. 3 illustrates a schematic top view of a via having two conductive paths, according to an embodiment of this invention.

FIG. 2 illustrates a schematic cross-sectional view of a via 240 having two conductive paths 241 and 242, according to an embodiment of this invention. FIG. 3 illustrates a schematic top view of the via 240 having two conductive paths 241, 242, according to an embodiment of this invention. Now referring to both FIGS. 2 and 3, the via 240 will be discussed in further detail.

The via 240 is formed within a substrate 220. Only a portion of the substrate 220 is shown for the sake of clarity. An opening 210 is formed within the substrate 220. The opening terminates near or at a first pad 251 and a second pad 252. As shown the via 240 is substantially annular. The conductive path 241 contacts the pad 251 while the conductive path 242 contacts the path 252. The first electrical path 241 and 251 are electrically isolated from the second electrical path 242, 252. The pads 251, 252 are located at a first level 260. The via 240 extends to a second level 262. The opening 210 is essentially a frusto-conical in shape between the first level 260 and the second level 262. The first level 260 corresponds to a base of the via 240 while the frusto-conical shaped opening up to the second level 262 is the sidewall or barrel 264 of the via 240.

Figure 4:
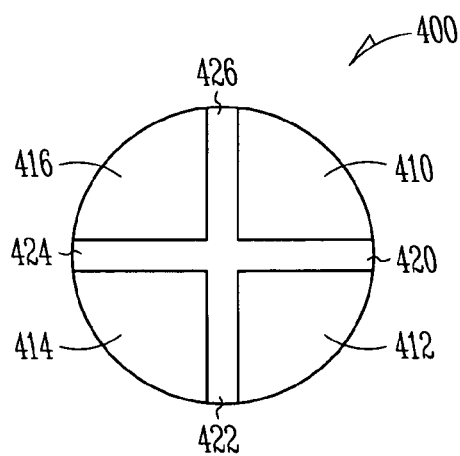
FIG. 4 illustrates a schematic top view of a via having multiple conductive paths, according to an embodiment of this invention.

FIG. 4 illustrates a schematic top view of a via 400 having multiple conductive paths 410, 412, 414, 416, according to an embodiment of this invention. Four pads (not shown) are positioned below each of the conductive paths or each of the sections of the via 410, 412, 414, 416. Each of the paths is isolated from each of the other paths 410, 412, 414, 416 by a portion of substrate material or other insulative material 420, 422, 424, 426. FIG. 4 illustrates that the via can have any number of conductive paths. It should be noted that the number of conductive paths is not limited to two or four as shown in FIGS. 1–3, and FIG. 4, respectively. The limiting factors on the number of conductive pads will be the physical limits of photolithography or other processes used to form a multiple conductive path via, and the spacing requirements between pads at the base of the via 400, and the spacing requirements between the electrical paths formed. Some applications for vias require minimum dielectric spacings.

Now referring to FIGS. 1–4, a substrate 120 includes a first conductive layer 113, a second conductive layer 114 substantially adjacent the first layer 113, and a via 140 for connecting an electrical portion of a circuit on the first conductive layer 113 to an electrical portion of a circuit on the second conductive layer 114, wherein the via 140 further includes a first electrical path 141 associated with the via 140, and a second electrical path 142 associated with the via 140. The first electrical path 141 is isolated from the second electrical path 142. A first electrical device 151 associated with the first electrical path 141, and a second electrical device 152 is associated with the second electrical path 142. In some embodiments, the via further comprises a third electrical path (shown in FIG. 4). In another embodiment, the via further includes a fourth electrical path (shown in FIG. 4). A first pad 251 is associated with the first electrical path 241, and a second pad 252 is associated with the second electrical path 242 (shown in FIG. 2). In some embodiments, the first electrical pad 251 associated with the first electrical path contacts a first portion of the via 241, and the second pad 252 associated with the second electrical path electrically contacts a second portion of the via 242. The first pad 251 is electrically isolated from the second pad 252.

Now referring to FIGS. 2 and 4, a via 240 within a substrate includes a base, and a sidewall 264 in electrical communication with the base 260. The base 260 and the sidewall 264 form a plurality of electrical paths 241, 242. Each electrical path 241, 242 includes a portion the base 260 and a portion of the sidewall 262 connected to the portion of the base 260. The via 240 includes an insulator positioned between each of the plurality of electrical paths 241, 242. In some embodiments, the via is split into two electrical paths 241, 242. In other embodiments, the via is split into plurality of electrical paths (see FIG. 4). The via 240 has a substantially annular shape. Each electrical path 241, 242 has a substantially equal pie shaped portion of the via 240. In one embodiment of the invention, one of the pie shaped portion of the via contacts at least two pads (see FIG. 10) in electrical contact with the via 1000. The via is adapted to individually contact each of a plurality of pads positioned in electrical contact with the via.

Now referring to FIGS. 1 and 2, an integrated circuit packaging substrate includes a first layer of conductive material 113, a second layer of conductive material 114, and a via 140 for interconnecting the first layer of conductive material 113 and the second layer of conductive material 114. The via 140 further includes a base 260 positioned at one of the first layer 113 and the second layer 114, and a sidewall 264 electrically connected to the base 260 and positioned between the first layer 113 and the second layer 114. At least one insulator electrically isolates a first portion 241 of the base and the sidewall from a second portion 242 of the base and the sidewall. The first portion of the base and the sidewall 241 is associated with a first electrical path and the second portion of the base and the sidewall 242 is associated with a second electrical path. The insulator separates the first electrical path 241 and the second electrical path 242 to provide a required dielectric spacing. In some embodiments, the insulator is a dielectric.

Figure 5:
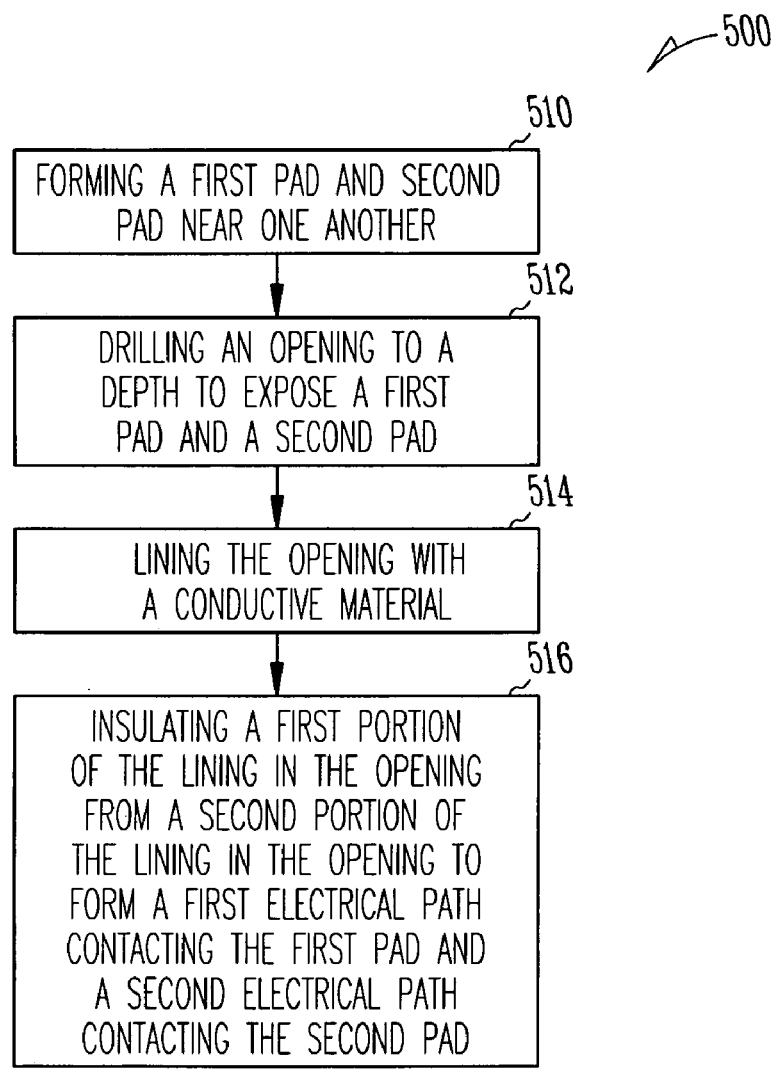
FIG. 5 is a flow diagram of a method for forming a via, according to an embodiment of this invention.

FIG. 5 is a flow diagram of a method 500 for forming a via, according to an embodiment of this invention. The method 500 for forming a via includes forming a first pad and a second pad near one another 510, drilling an opening to a depth to expose a first pad and a second pad 512, lining the opening with a conductive material 514, and insulating a first portion of the lining in the opening from a second portion of the lining in the opening to form a first electrical path contacting the first pad and a second electrical path contacting the second pad 516. In some embodiments, lining the opening with conductive material 514 includes depositing copper on the surface of the opening. In one embodiment, insulating a first portion of the lining from the second portion of the lining 516 includes masking a first portion of the lining and the second portion of the lining, and etching an unmasked portion of the lining to remove the unmasked portion of the lining and separate the first portion of the lining from the second portion of the lining. In other embodiments, insulating a first portion of the lining from the second portion of the lining 516 includes patterning a portion of photoresist that corresponds to the insulative portion, and plating the opening with a conductive material while the patterned portion of photoresist is in place. The method 500 further includes removing the patterned photoresist that corresponds to the insulative portion to form a first portion of the lining that is isolated from the second portion of the lining.

Figure 6:
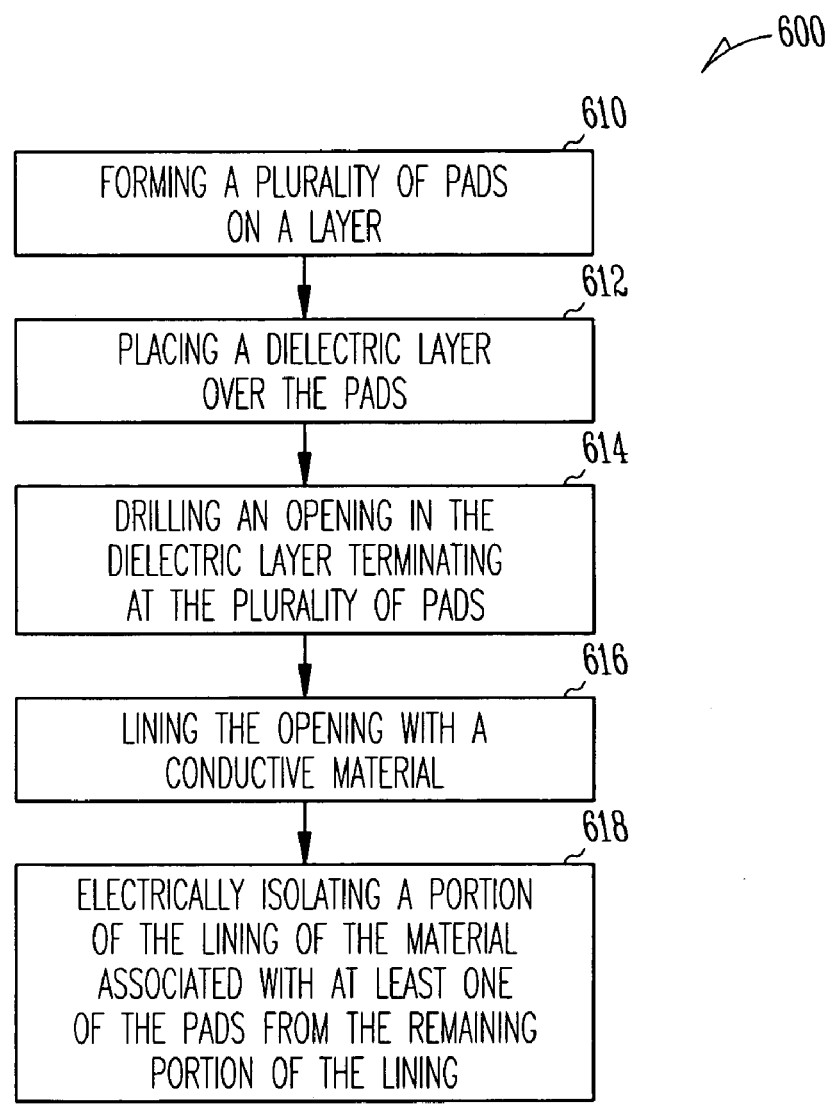
FIG. 6 is a flow diagram of a method for forming a via, according to another embodiment of this invention.

FIG. 6 is a flow diagram of a method 600 for forming a via, according to another embodiment of this invention. The method 600 for forming a via in an integrated circuit package substrate includes forming a plurality of pads on a layer 610, placing a dielectric layer over the pads 612, and drilling an opening in the dielectric layer terminating at the plurality of pads 614. Next, the opening is lined with a conductive material 616. A portion of the lining of the material associated with at least one of the pads is isolated from the remaining portion of the lining 618.

Figure 7:
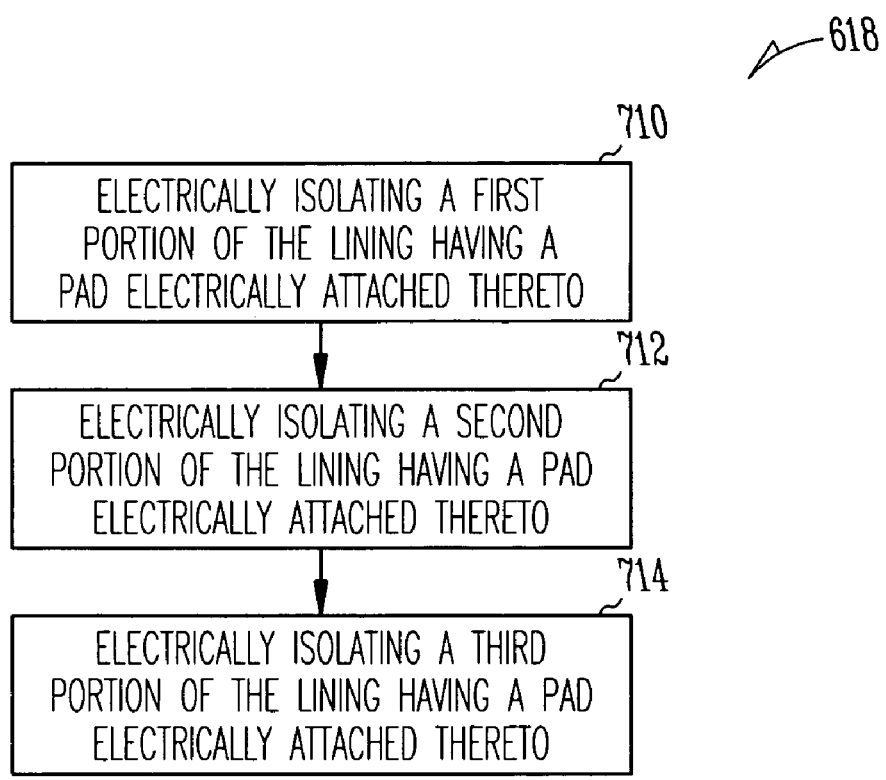
FIG. 7 is a flow diagram that further details the electrical isolation during the formation of a via, according to an embodiment of the invention.

FIG. 7 is a flow diagram that further details the electrical isolation 618, according to an embodiment of the invention. Electrically isolating a portion of the lining 618 includes electrically isolating a first portion of the lining having a pad electrically attached thereto 710, and electrically isolating a second portion of the lining having a pad electrically attached thereto 712. Some embodiments further include electrically isolating a third portion of the lining having a pad electrically attached thereto 714. In some embodiments, electrically isolating a portion of the lining of the material associated with at least one of the pads from the remaining portion of the lining includes etching away a portion of the lining. In some embodiments, electrically isolating a portion of the lining of the material associated with at least one of the pads from the remaining portion of the lining includes removing a photoresist portion.

Figure 8A:
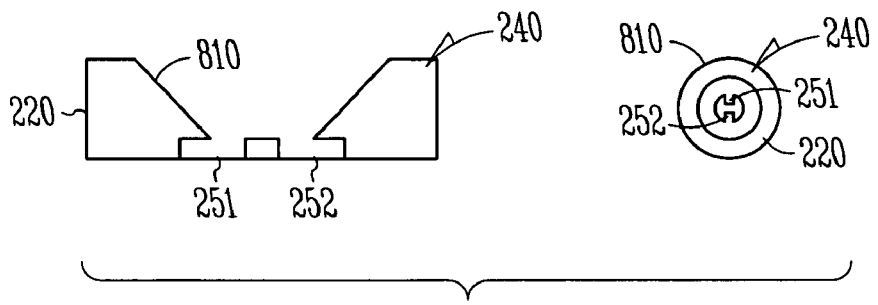
FIG. 8A illustrates a schematic cross-sectional view and a top view of a via after an opening has been drilled in the dielectric, according to an embodiment of this invention.
Figure 8B:
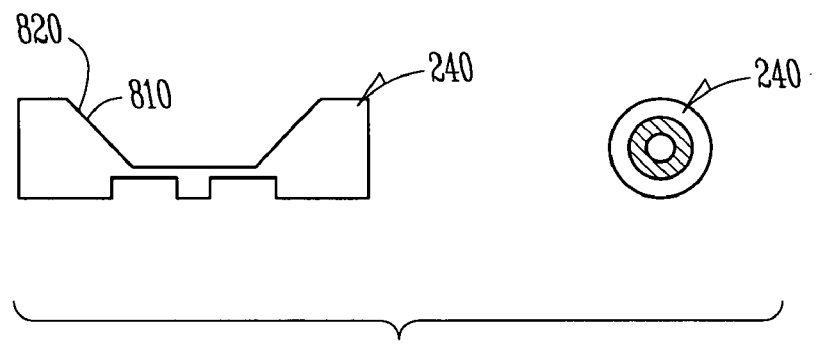
FIG. 8B illustrates a schematic cross-sectional view and a top view of a via after depositing a conductive layer on the via opening, according to an embodiment of this invention.

It should be noted that there are many ways to form the vias described in FIGS. 1 through 7 and 10. FIGS. 8A to 8F are schematic cross-sectional views and top views of a via as it is formed, according to an embodiment of this invention. FIG. 8A illustrates a schematic cross-sectional view and a top view of a via 240 after an opening has been drilled in the dielectric substrate 820. The opening 810 is formed by drilling into the dielectric substrate 220. The drilling operation can be done in any of a number of ways including using a laser directed at the substrate. Drilling stops or terminates when the opening 810 is at or includes the pads 251 and 252. FIG. 8B illustrates a schematic cross-sectional view and top view of the via 240 after a conductive layer 820 is deposited onto the surface of the opening 810, according to an embodiment of this invention. The conductive layer 820, in one embodiment, is copper. The conductive layer 820 may be deposited onto the surface of the opening 810 by plating or sputtering or any other deposition process.

Figure 8C:
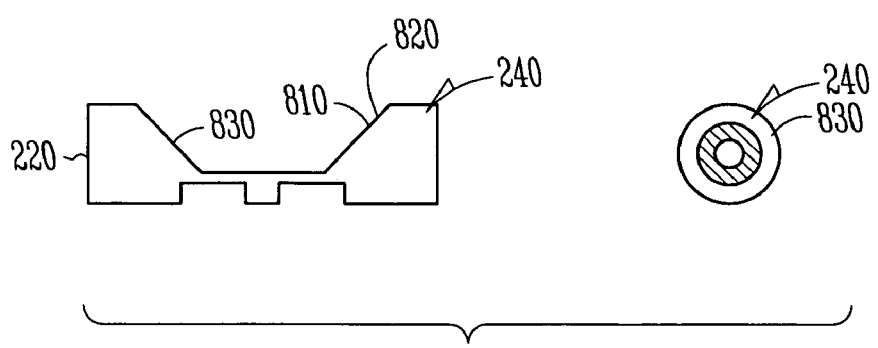
FIG. 8C illustrates a schematic cross-sectional view and a top view of a via after depositing a photoresist layer on the via opening, according to an embodiment of this invention.
Figure 8D:
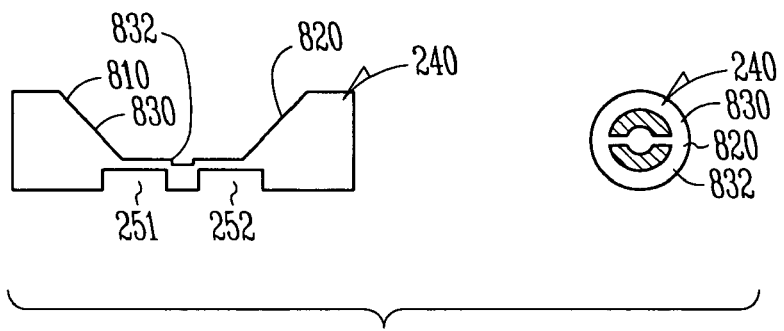
FIG. 8D illustrates a schematic cross-sectional view and a top view of a via after patterning the photoresist layer in the via opening, according to an embodiment of this invention.

FIG. 8C illustrates a schematic cross-sectional view and top view of a via 240 after a photoresist layer 830 is placed upon the conductive layer 810. FIG. 8D illustrates a schematic cross-sectional view and top view of the via 240 after patterning the photoresist layer 830 in the via opening 810, according to an embodiment of this invention. Patterning is accomplished by placing a mask over a light source. The photoresist can be either positive photoresist or negative photoresist. The end result of patterning is that the portion of the exposed photoresist remains when a portion of the photoresist is removed. In other words, the opening 810 is masked with a mask. A light source is placed on one side of the mask. A portion of the photoresist layer 830 is exposed. Either the unexposed or exposed portion is removed, depending upon whether the photoresist is a positive photoresist or a negative photoresist. The portion that is removable as shown in FIG. 8D is a slit or space 832 in the layer of photoresist 830. The conductive layer 820 is exposed or seeable through the space 832, as shown in the top view shown of FIG. 8D.

Figure 8E:
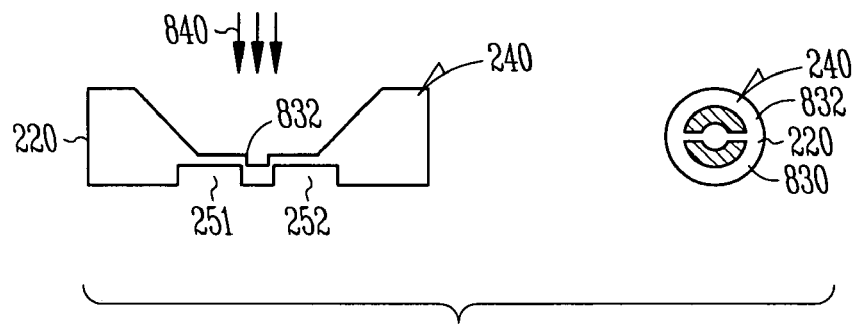
FIG. 8E illustrates a schematic cross-sectional view and a top view of a via after etching a portion of the conductive layer in the via opening, according to an embodiment of this invention.
Figure 8F:
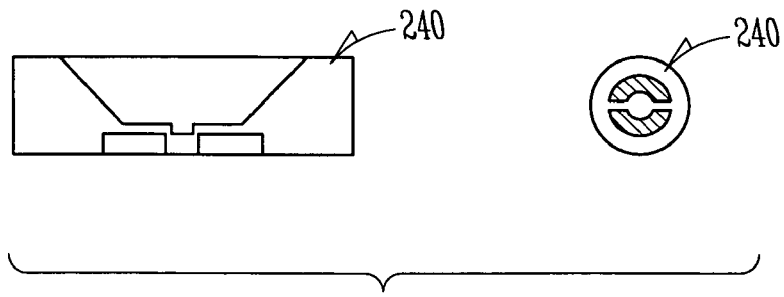
FIG. 8F illustrates a schematic cross-sectional view and a top view of a via of a completed via, according to an embodiment of this invention.

FIG. 8E illustrates a schematic cross-sectional view and top view of a via 810 after etching a portion of the conductive layer 820 in the via opening 810, according to an embodiment of this invention. As shown in FIG. 8E, etching is depicted by the arrows which have the reference numeral 840. The etch can be either a liquid etch or a dry etch. The end result of the 840 is that the exposed portion of the copper layer corresponding to the copper or conductive layer 820 below or the slit 832 in the photoresist 830 is removed. The end result is that the substrate or dielectric material comprising the substrate 220 can be seen through the slit 832. It should be noted that the slit 832 is positioned exactly between the pads 251 and 252. FIG. 8F illustrates a schematic cross-sectional view and top view of the via 240 as completed by removing the remaining layer of photoresist 830. The end result, as shown by FIG. 8F is the via shown in FIGS. 2 and 3. Again, it should be noted that the process described in FIGS. 8A to 8F shows the via being split into two conductive paths, and that the via can be made with any number of different electrical pathways corresponding to the pads. The slits or openings in the photoresist and the subsequent etch, shown in FIG. 8E, are used to isolate the various pads from one another. Therefore the slits are positioned between the pads and the subsequent etch is used to remove the conductive material between the pads to isolate the pads from other pads. As mentioned previously, the number of pads that could be provided, as well as the number of electrical paths that could be made is only limited by the required dielectric spacing and limitations in the photolithographic processes for forming a number of electrical pathways in pads.

Figure 9A:
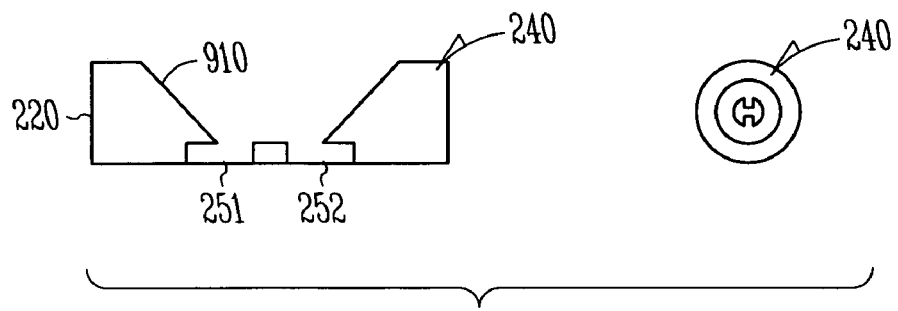
FIG. 9A illustrates a schematic cross-sectional view and a top view of a via after an opening has been drilled in the dielectric, according to an embodiment of this invention.

FIGS. 9A to 9E illustrate schematic cross-sectional views and top views of a via 240 which is formed by another method, according to another embodiment of this invention. FIG. 9A illustrates a schematic cross-sectional view and top view of a via 240 after an opening 910 has been drilled in the dielectric substrate 220. The opening 910 formed in the dielectric substrate material 220 terminates near the pads 251, 252. In other words, the bottom of the opening or base of the opening 910 includes exposed pads 251, 252. The drilling can be formed by a mechanical drill or a laser can be used to remove dielectric material until the pads 251, 252 are exposed.

Figure 9B:
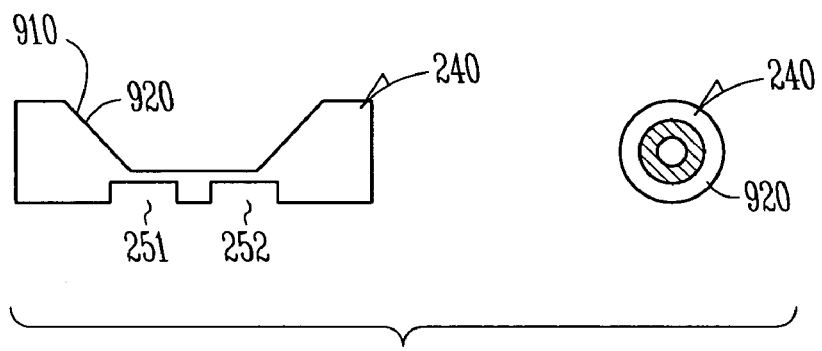
FIG. 9B illustrates a schematic cross-sectional view and a top view of a via after depositing a photoresist layer on the via opening, according to an embodiment of this invention.
Figure 9C:
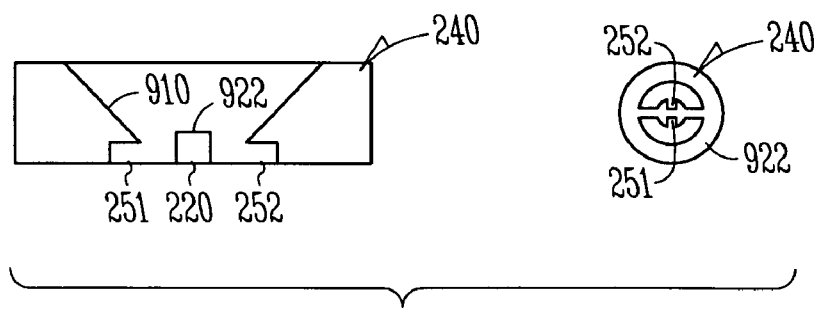
FIG. 9C illustrates a schematic cross-sectional view and a top view of a via after patterning the photoresist layer in the via opening, according to an embodiment of this invention.
Figure 9D:
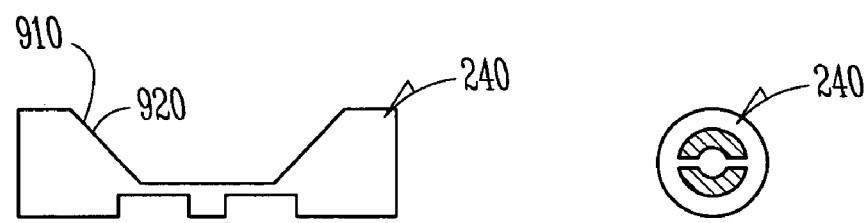
FIG. 9D illustrates a schematic cross-sectional view and a top view of a via after plating the via opening with a conductive material, according to an embodiment of this invention.
Figure 9D:

FIG. 9B illustrates a schematic cross-sectional view and a top view of a via 240 after a photoresist layer 920 is deposited onto the via opening 910, according to an embodiment of this invention. The photoresist layer 920 completely covers the opening 910. FIG. 9C illustrates a schematic cross-sectional view and top view of the via 240 after patterning the photoresist layer 920, according to an embodiment of this invention. Again a mask is used to expose portions of the photoresist layer. The photoresist layer 920 can be either a positive or negative photoresist material. The end result of exposing and removing a portion of the photoresist layer as shown in FIG. 9C. As shown after exposure and removal of the photoresist layer a slit of photoresist layer 922 is left on top of the substrate material or dielectric material 220 positioned between the pads 251, 252. FIG. 9D illustrates a schematic cross-sectional view and top view of a via 240 after plating the via opening 910 with a conductive material 930. The conductive material 930 can be any sort of conductive material, however, copper is used in one embodiment of the invention. After the plating step the opening 910 has a layer of plating material which connects the base of the opening and the side wall of the opening 910 on one side and a similar plating material which goes along the opposite side of the opening 910 and includes a portion of the base. Each of these portions are separated by the strip of photoresist material 922.

Figure 9E:
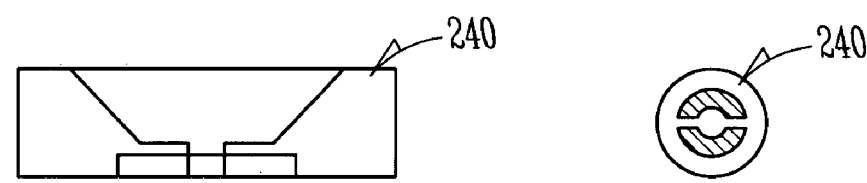
FIG. 9E illustrates a schematic cross-sectional view and a top view of a via after removing the remaining photoresist, according to an embodiment of this invention.
Figure 9E:

FIG. 9E illustrates a schematic cross-sectional view and top view of the via 240 after removing the remaining strip of photoresist material 922 according to an embodiment of this invention. The end result is that the via 240 as shown in FIG. 9E is identical to the via shown in FIGS. 2 and 3. Again it should be noted that this method can be used to form a via having more than two electrical pathways or electrical paths. It should be noted that the only limitations on the number of electrical pathways that can be formed would be the dielectric spacing as well as the limitations inherent to the photolithographic processes used.

Figure 10:
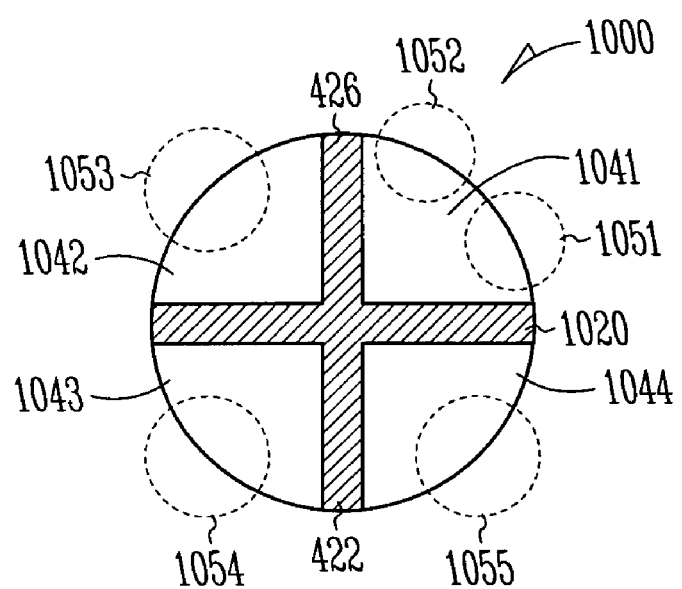
FIG. 10 is a top view of a via in which one portion of the via contacts two pads, according to an embodiment of this invention.

FIG. 10 is a top view of a via 1000 in which one portion of a via contacts two electrical pads, according to an embodiment of this invention. Positioned below the via are contact pads 1051, 1052, 1053, 1054, 1055. The contact pads 1051, 1052, 1053, 1054, 1055 are shown in phantom since the pads 1051, 1052, 1053, 1054, 1055 are below the via 1000. The via 1000 includes four different electrical portions 1041, 1042, 1043, 1044 which are separated by insulative material 1020. The insulative material 1020 is shown in the form of a cross. It should be noted that section 1041 or electrical pathway 1041 of the via 1000 contacts two pads 1051 and 1052. Section 1042 of the via contacts pad 1053, and section 1043 contacts pad 1054 and section 1044 contacts pad 1055. Thus, electrical pads 1051, 1052, and portion 1041 of the via form part or a portion of a first electrical path while section 1042 and pad 1043 form a second portion of a separate electrical path. Similarly section 1043 or portion 1043 and pad 1054 form another portion of an electrical path and section 1044 and pad 1055 form yet another electrical pathway. Section 1041 could be used as a bridge between two pads 1051, 1052 in some applications.

One embodiment of the invention includes a system that has a device with at least one integrated circuit. The integrated circuit of the system further includes a first layer of conductive material, a second layer of conductive material, and a via having multiple electrical paths for interconnecting the first layer of conductive material and the second layer of conductive material. The via includes an opening lined with a conductive material, the multiple electrical paths are formed, in some embodiments, by splitting the lining into multiple electrical paths. In some embodiments, the via includes an opening, the multiple electrical paths are formed by splitting the opening into sections with a removable material and lining the opening with a conductive material and removing the removable material to form multiple electrical paths.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A substrate comprising:
   a first conductive layer;
   a second conductive layer substantially adjacent the first layer but electrically isolated from the first conductive layer;
   a via for connecting an electrical portion of a circuit on the first conductive layer to an electrical portion of a circuit on the second conductive layer, wherein the via further comprises:
   a first electrical path within the via; and
   a second electrical path within the via; and
   an insulative material substantially filling the via, the insulative material separating the first electrical path from the second electrical path.

2. The substrate of claim 1 further comprising:
   a first electrical device associated with the first electrical path; and
   a second electrical device associated with the second electrical path.

3. A substrate comprising:
   a first conductive layer;
   a second conductive layer substantially adjacent the first layer but electrically isolated from the first conductive layer;
   a via for connecting an electrical portion of a circuit on the first conductive layer to an electrical portion of a circuit on the second conductive layer, wherein the via further comprises:
   a first electrical path within the via; and
   a second electrical path within the via; and
   an insulative material within the via, the insulative material separating the first electrical path from the second electrical path, wherein the via further comprises a third electrical path associated with the via.

4. The substrate of claim 3 wherein the via further comprises a fourth electrical path associated with the via.

5. The substrate of claim 1 further comprising:
   a first pad associated with the first electrical path; and
   a second pad associated with the second electrical path.

6. The substrate of claim 1 wherein the first pad associated with the first electrical path, and the second pad associated with the second electrical path electrically contact a portion of the via, the first pad electrically isolated from the second pad.

7. A via within a substrate comprising:
   a base; and
   a sidewall having portions in electrical communication with portions of the base, wherein the base and the sidewall form a plurality of electrical paths, wherein each electrical path includes a portion of the base and a portion of the sidewall connected to the portion of the base, the via having a substantially annular shape, the via having an axis, the distance between each of the plurality of electrical paths in the via and the axis of the via being substantially equal.

8. The via of claim 7 further comprising an insulator positioned between each of the plurality of electrical paths.

9. The via of claim 7 wherein the via is split into two electrical paths.

10. A via within a substrate comprising:
a base; and
a sidewall in electrical communication with the base, wherein the base and the sidewall form a plurality of electrical paths, wherein each electrical path includes a portion the base and a portion of the sidewall connected to the portion of the base, wherein the via is split into plurality of electrical paths, the via having a substantially annular shape and each electrical path having a substantially equal pie shaped portion of the via, the via having an axis, the distance between each of the plurality of electrical paths in the via and the axis of the via being substantially equal.

11. The via of claim 10 wherein one of the pie shaped portion of the via contacts at least two pads in electrical contact with the via.

12. The via of claim 7 adapted to individually contact each of a plurality of pads positioned in electrical contact with the via.

13. The substrate of claim 1 wherein the substrate is part of an integrated circuit package.

14. The substrate of claim 13 wherein the integrated circuit package is a portion of a system.

15. The substrate of claim 1 further comprising a pad on the first conductive layer connected to one of the first electrical path or the second electrical path associated with the via.

16. The substrate of claim 1 further comprising:
a first pad on the first conductive layer;
a second pad on the first conductive layer, wherein the first pad and the second pad are communicatively coupled to one of the first electrical path or the second electrical path associated with the via.

17. The substrate of claim 16 further comprising a third pad on the first conductive layer connected to the other of the first electrical path or the second electrical path associated with the via.

18. The substrate of claim 16 further comprising a third pad on the second conductive layer connected to the one of the first electrical path or the second electrical path associated with the via.

19. The substrate of claim 16 further comprising:
a first device electrically connected to the first pad; and
a second device electrically connected to the second pad.

20. A substrate comprising:
a first conductive layer;
a second conductive layer substantially adjacent the first layer but electrically isolated from the first conductive layer;
a via for connecting an electrical portion of a circuit on the first conductive layer to an electrical portion of a circuit on the second conductive layer, wherein the via further comprises:
a first electrical path within the via; and
a second electrical path within the via; and
an insulative material within the via, the insulative material separating the first electrical path from the second electrical path, wherein the via is split into plurality of electrical paths, the via having a substantially annular shape and each electrical path having a substantially equal pie-shaped portion of the via.

21. The substrate of claim 20 wherein the via includes a third electrical path, the via having a substantially annular shape and each of the first electrical path, the electrical path, and the third electrical path, having a substantially equal pie shaped portion of the via.

22. The via of claim 7 further comprising at least one electrical device associated with one of the plurality of electrical paths.

23. The via of claim 7 further comprising:
a first pad; and
a second pad associated with at least one of the plurality of electrical paths.

24. The via of claim 23 further comprising:
a first device associated with the first pad; and
a second device associated with the second pad.

25. The via of claim 7 further comprising:
a first pad associated with a first electrical path of the plurality of electrical paths; and
a second pad associated a second electrical path of the plurality of electrical paths.

26. The via of claim 25 wherein the first pad associated with the first electrical path, and the second pad associated with the second electrical path electrically contact a portion of the via, the first pad electrically isolated from the second pad.

27. The via positioned within a substrate of claim 7 being part of an integrated circuit package.

28. The substrate of claim 27 wherein the integrated circuit package is a portion of a system.

* * * * *

UNITED STATES PATENT AND TRADEMARK OFFICE
CERTIFICATE OF CORRECTION

| | | |
|---|---|---|
| PATENT NO. | : 7,183,653 B2 | Page 1 of 1 |
| APPLICATION NO. | : 10/740957 | |
| DATED | : February 27, 2007 | |
| INVENTOR(S) | : Myers et al. | |

It is certified that error appears in the above-identified patent and that said Letters Patent is hereby corrected as shown below:

In column 10, line 23, in Claim 21, after "path, the" insert -- second --.

Signed and Sealed this

Twenty-ninth Day of May, 2007

JON W. DUDAS
*Director of the United States Patent and Trademark Office*